(12) United States Patent
Tuan

(10) Patent No.: US 7,212,462 B1
(45) Date of Patent: May 1, 2007

(54) STRUCTURE AND METHOD FOR SUPPRESSING SUB-THRESHOLD LEAKAGE IN INTEGRATED CIRCUITS

(75) Inventor: Tim Tuan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 178 days.

(21) Appl. No.: 10/701,835

(22) Filed: Nov. 4, 2003

(51) Int. Cl.
*G11C 7/00* (2006.01)

(52) U.S. Cl. .................. 365/226; 365/154; 365/189.11

(58) Field of Classification Search ................ 365/226, 365/189.09, 189.11, 227, 189.12, 154
See application file for complete search history.

(56) References Cited

U.S. PATENT DOCUMENTS

| | | | | |
|---|---|---|---|---|
| 5,412,599 A | * | 5/1995 | Daniele et al. | ........ 365/185.14 |
| 6,166,985 A | * | 12/2000 | McDaniel et al. | .......... 365/226 |
| 6,538,954 B2 | * | 3/2003 | Kunikiyo | ................ 365/230.05 |
| 6,807,109 B2 | * | 10/2004 | Tomishima | ............ 365/189.09 |
| 6,829,194 B2 | * | 12/2004 | Honda et al. | ................ 365/226 |
| 7,042,756 B2 | * | 5/2006 | Madurawe | ................... 365/154 |
| 2005/0091630 A1 | * | 4/2005 | Madurawe | .................... 326/37 |

* cited by examiner

*Primary Examiner*—David Lam
(74) *Attorney, Agent, or Firm*—Jeanette S. Harms; Lois D. Cartier

(57) ABSTRACT

Techniques for reducing leakage power in the transistors of integrated circuits are provided. Suppressing sub-threshold leakage techniques can be applied to memory cells that drive the gates of the transistors, memory cells that drive the sources of the transistors, and level shifters that drive the gates of the transistors. In these techniques, an appropriate gate to source voltage ($V_{GS}$) can be applied to a transistor in its off state. Of importance, this $V_{GS}$ can under-drive the transistor, which significantly reduces the sub-threshold leakage of that transistor. These techniques fail to affect a transistor in its on state, thereby ensuring that high speed performance of the integrated circuit can be maintained.

18 Claims, 13 Drawing Sheets

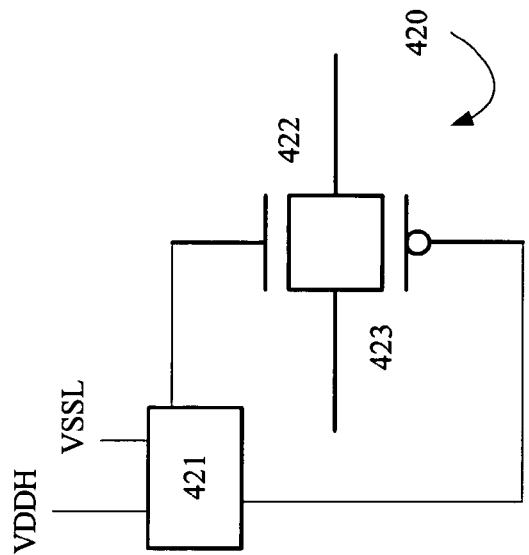
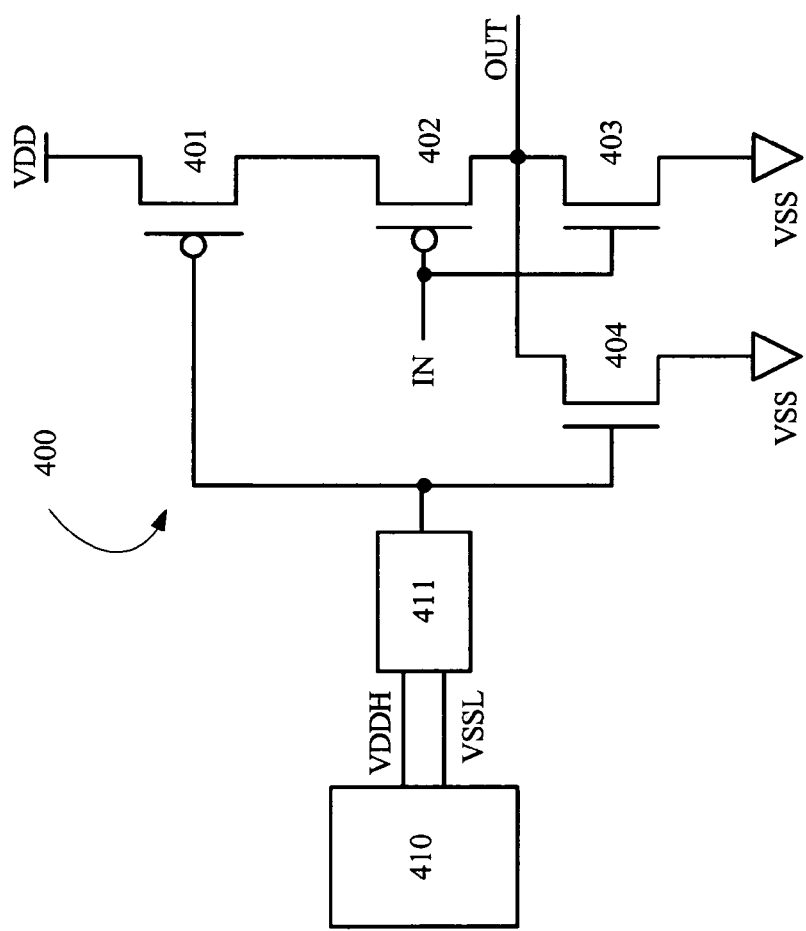
Figure 4B
Figure 4A

STRUCTURE AND METHOD FOR SUPPRESSING SUB-THRESHOLD LEAKAGE IN INTEGRATED CIRCUITS

BACKGROUND OF THE INVENTION

1. Field of the Invention

The present invention relates to suppressing sub-threshold leakage by under-driving transistors in their off state.

2. Discussion of the Related Art

Integrated circuits can include hundreds, thousands, or even millions of transistors. Each of these transistors can be in either an on (i.e., conducting) state or an off (i.e., non-conducting) state. Ideally, in an off state, a transistor would have zero power dissipation. Unfortunately, some static power dissipation in an integrated circuit can occur due to sub-threshold leakage current in these off transistors.

Some integrated circuits are particularly susceptible to such static power dissipation. For example, due to shrinking transistor dimensions, supply voltages, and threshold voltages, the sub-threshold leakage current in standard programmable logic devices (PLDs) has been increasing rapidly. In fact, at the current rate of increase, sub-threshold leakage current could quickly become the primary source of power dissipation in PLDs. For some PLDs that provide high power applications, high leakage power can lead to increased on-chip heating, thereby increasing the design and implementation costs of heat management. For other PLDs that use low-cost packaging, high leakage power can overtax the generally poor thermal qualities of such packaging. For yet other PLDs where minimizing usage of battery resources is critical, high leakage power prevents the use of such PLDs in various consumer products (e.g., wireless and handheld devices). Consequently, a need arises for techniques to reduce sub-threshold leakage current in PLDs.

SUMMARY OF THE INVENTION

A method of suppressing sub-threshold leakage in a transistor of an integrated circuit is provided. In this method, a gate to source voltage ($V_{GS}$) can be applied to the transistor. Of importance, this $V_{GS}$ can under-drive the transistor.

In one embodiment, if the transistor is an NMOS device, then providing the appropriate $V_{GS}$ can include applying a slightly negative voltage to a gate of the transistor. The slightly negative voltage can be between 0 and approximately −0.2 V. For example, the slightly negative voltage could be approximately −0.1 V.

In another embodiment, if the transistor is an NMOS device having a gate voltage of 0 V, then providing the appropriate $V_{GS}$ can include applying a slightly positive voltage to the source of the transistor. The slightly positive voltage can be between 0 and approximately 0.2 V. For example, the slightly positive voltage could be approximately 0.1 V.

In one embodiment, if the transistor is a PMOS device, then providing the appropriate $V_{GS}$ can include applying a slightly more positive voltage than VDD (i.e., a standard high voltage supply) to a gate of the transistor. The slightly more positive voltage can be VDD+N, wherein $0<N\circ 0.2$ V. For example, the slightly more positive voltage could be approximately VDD+0.1 V.

In another embodiment, if the transistor is a PMOS device having a gate voltage of VDD, then providing the appropriate $V_{GS}$ can include applying a slightly less positive voltage than VDD to the source of the transistor. The slightly less positive voltage can be VDD−N, wherein $0<N\circ 0.2$ V. For example, the slightly positive voltage could be approximately VDD−0.1 V.

In one embodiment, to provide the appropriate $V_{GS}$, a level shifter can be provided to receive a logic (i.e., non-memory) signal and generate a modified gate voltage for the transistor. The modified gate voltage for an NMOS device can be slightly less than a source voltage of that transistor, whereas the modified gate voltage for a PMOS device can be slightly greater than a source voltage of that transistor.

A memory cell for suppressing sub-threshold leakage in a transistor is also provided. The memory cell can include a plurality of transistors configurable to store a value. Of importance, that value can under-drive the transistor in its off state. If the transistor is an NMOS device having a source voltage of VSS (i.e., a standard low voltage supply) and the memory cell drives a gate of the transistor, then the value is slightly more negative than VSS. If the transistor is a PMOS device having a source voltage of VDD and the memory cell drives a gate of the transistor, then the value is slightly more positive than VDD.

On the other hand, if the transistor is an NMOS device having a gate voltage of VSS and the memory cell drives the source of the transistor, then the value is slightly more positive than VSS. If the transistor is a PMOS device having a gate voltage of VDD and the memory cell drives the source of the transistor, then the value is slightly less than VDD.

A level shifter for receiving a non-memory signal and generating a modified gate voltage for a transistor is also provided. The modified gate voltage is able to suppress sub-threshold leakage in the transistor. If the transistor is an NMOS device, then the level shifter includes means for generating slightly less than a source voltage of the transistor for the modified gate voltage. If the transistor is a PMOS device, then the level shifter includes means for generating slightly greater than a source voltage of the transistor for the modified gate voltage.

A structure for suppressing sub-threshold leakage in a transistor is also provided. The structure includes means for creating a negative gate to source voltage when the transistor is in its off state.

BRIEF DESCRIPTION OF THE FIGURES

FIG. 4A illustrates an exemplary 2-input NOR gate that can receive negative voltage VSSL and positive voltage VDDH to suppress some sub-threshold leakage in the logic gate.

FIG. 4B illustrates an exemplary transmission gate controlled by a memory cell. The memory cell can receive negative voltage VSSL and positive voltage VDDH to suppress sub-threshold leakage in the transmission gate.

DETAILED DESCRIPTION OF THE FIGURES

Techniques for reducing leakage power in integrated circuits are provided. Specifically, in accordance with one embodiment of the invention, suppressing sub-threshold leakage techniques can be applied to memory cells that drive the gates of transistors in the integrated circuits. In another embodiment, suppressing sub-threshold leakage techniques can be applied to memory cells that drive the sources of transistors in the integrated circuits. In yet another embodiment, suppressing sub-threshold leakage techniques can be applied to level shifters that drive the gates of transistors in the integrated circuits. To clarify aspects of such techniques, a general description of sub-threshold leakage is now provided.

Sub-threshold leakage current ($I_{SUB}$) is the current from a drain terminal to a source terminal in a transistor that is supposed to be off, i.e., non-conducting. Equation 1 models the drain-source current ($I_{DS}$) for a transistor in weak inversion ($V_{GS} < V_{TH}$) (wherein $V_{GS}$ is the voltage across the gate and source terminals and $V_{TH}$ is the threshold voltage). Sub-threshold leakage is $I_{DS}$ when $V_{GS}=0$.

$$I_{DS} = I_0 \cdot 10^{\frac{V_{GS} - V_{TH}}{n \cdot v_t}} \quad \text{Equation 1}$$

In Equation 1, $I_0$ is the current when the transistor is completely on ($V_{GS} \geq V_{TH}$) and $n \circ v_t$ is the sub-threshold swing that is defined as the change in $V_{GS}$ required to decrease $I_{DS}$ by one decade (note that n is a process-dependent constant and $v_t$ is the thermal voltage). Of importance, the sub-threshold leakage $I_{DS}$ decreases by 10× when $V_{GS}$ decreases by the sub-threshold swing $n \circ v_t$.

Figure 1:
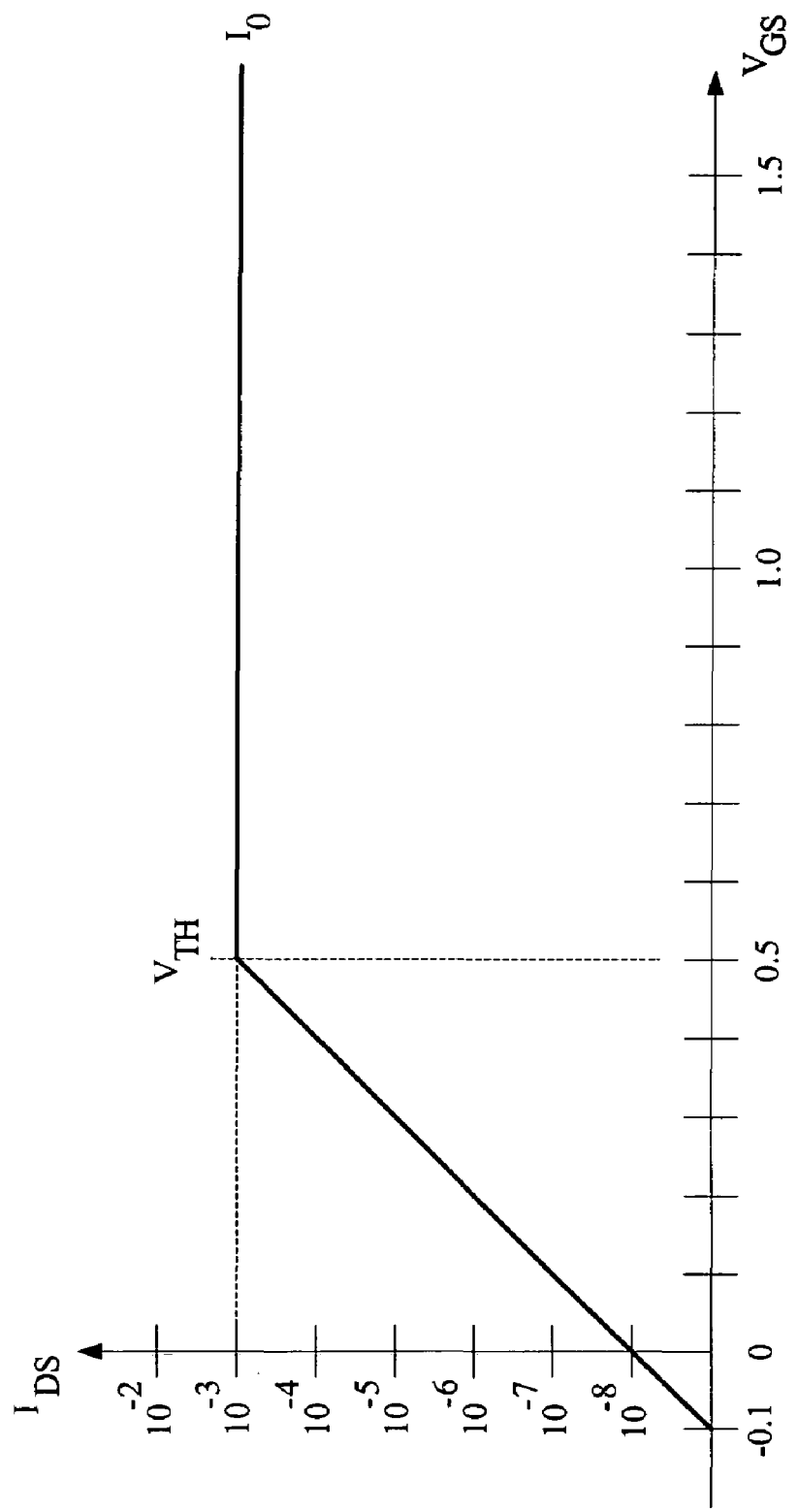
FIG. 1 shows the $I_{DS}$ curve of an exemplary transistor.

FIG. 1 shows the $I_{DS}$ curve of an exemplary transistor with $I_0=1$ mA, $V_{TH}=0.5$ V, and $n \circ v_t=100$ mV. When the transistor is completely on, $I_{DS}=I_0=1$ mA. As the transistor begins to turn off (i.e., as $V_{GS}$ decreases), $I_{DS}$ drops by one decade for each $n \circ v_t$ (100 mV) decrease of $V_{GS}$. When $V_{GS}$ reaches 0 V, it has decreased 0.5 V (i.e., five $n \circ v_t$'s). Hence, the cut-off current is five decades below $I_0$, or 10 nA. In accordance with one aspect of the invention, an appropriate $V_{GS}$ can be applied to a transistor using a memory cell or a level shifter.

Figure 2:
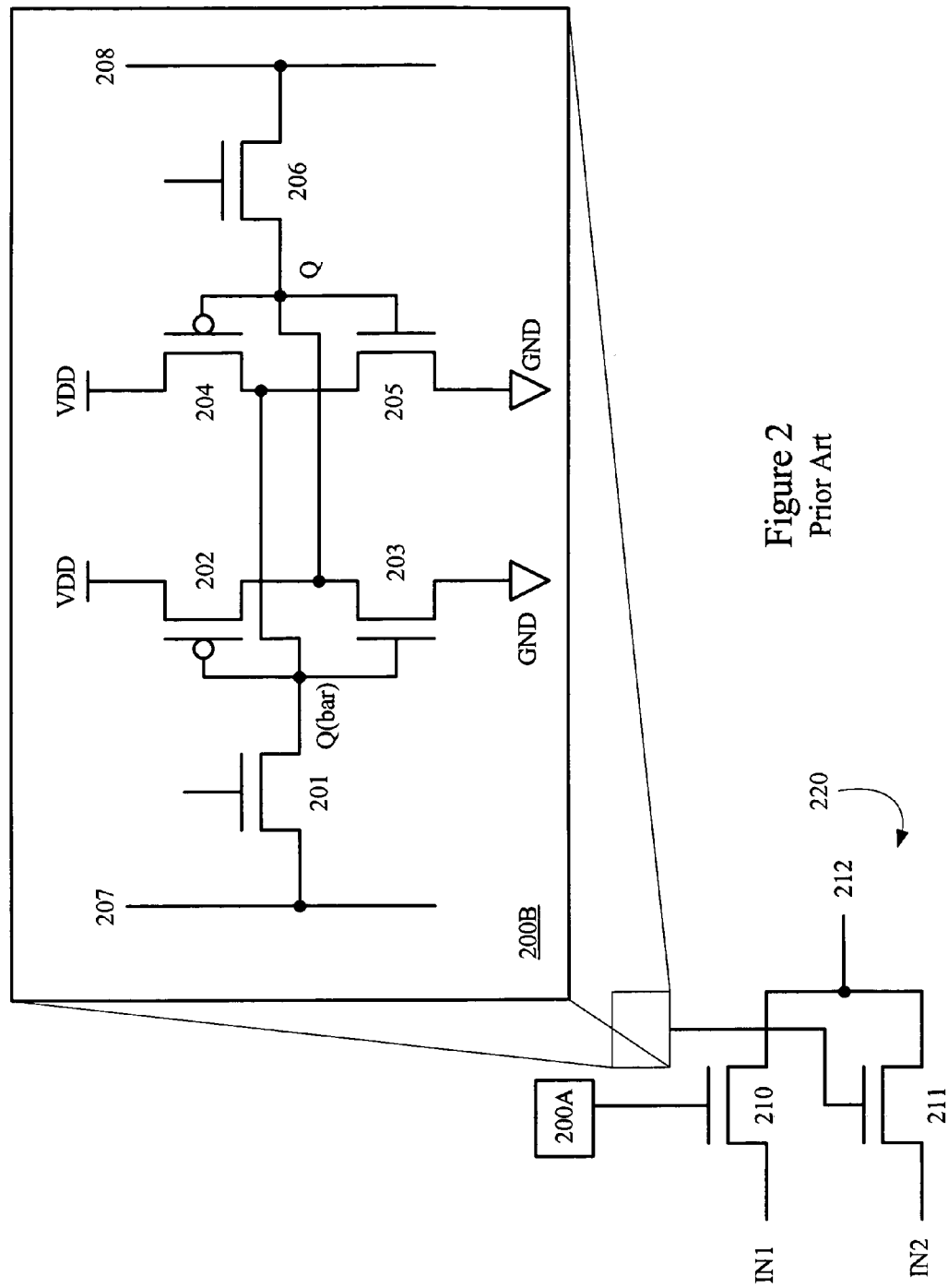
FIG. 2 shows a simple 2-to-1 multiplexer formed by pass transistors, which are controlled by memory cells (one memory cell shown in detail).

Some integrated circuits, such as programmable logic devices (PLDs), have reconfigurable areas where at least some of their inputs are controlled by memory cells. These inputs can control the gates of transistors. For example, memory cells can control the gates of pass transistors forming a multiplexer. FIG. 2 shows a simple 2-to-1 multiplexer formed by pass transistors 210 and 211, which are controlled by memory cells 200A and 200B, respectively. Because pass transistors 210 and 211 are NMOS transistors, providing a 0 V gate voltage results in transistors 210 and 211 being in an inactive state (i.e., the pass transistors are considered off).

FIG. 2 further illustrates one standard embodiment for a memory cell. In this embodiment, memory cell 200B includes six transistors 201–206. PMOS transistors 202 and 204 and NMOS transistors 203 and 205 are connected to form a latch.

Specifically, transistors 202 and 203 are connected in series between a high voltage source VDD and a low voltage source GND (i.e., 0 V). Similarly, transistors 204 and 205 are connected in series between VDD and GND. A voltage applied to the gates of transistors 202 and 203 is also applied to the drains of transistors 204 and 205. A voltage applied to the gates of transistors 204 and 205 is also applied to the drains of transistors 202 and 203.

To read or write to memory cell 200B, NMOS transistor 201 is coupled between bit line 207 and the gates of transistors 202 and 203. Similarly, NMOS transistor 206 is coupled between bit line 208 and the gates of transistors 204 and 205. An exemplary write operation will now be described. Assume that the output of memory cell 200B is coupled to bit line 208.

To program memory cell 200B with a "0" value, a high voltage can be applied to bit line 207 and a low voltage can be applied to bit line 208. At this point, transistors 201 and 206 can be turned on by providing a high voltage to their gates (e.g., provided by a word line, not shown). The high voltage provided to bit line 207 is transferred to the gates of transistors 202 and 203, thereby turning on transistor 203 and turning off transistor 202. The low voltage provided to bit line 208 is transferred to the gates of transistors 204 and 205, thereby turning on transistor 204 and turning off transistor 205. The cross-coupled configuration, i.e., the gates of transistors 202 and 203 to the drains of transistors 204 and 205 as well as the gates of transistors 204 and 205 to the drains of transistors 202 and 203, can hold the logic values Q (in this example, 0) and Q(bar) (in this example, 1) after programming is complete. Because memory cell 200B is used as a configuration memory that controls the behavior of the circuit (e.g., the multiplexer), its contents must be read constantly. Therefore, the memory cell outputs are taken directly from the nodes providing Q and Q(bar). Note that, in this embodiment, memory cell 200A is programmed to hold an opposite value to that programmed in memory cell 200B, thereby allowing multiplexer 220 to pass only one of inputs IN1 and IN2 to an output line 212.

In accordance with one feature of the invention, because sub-threshold leakage current decreases exponentially with a $V_{GS}$ decrease, the leakage of pass transistors 210 and 211 can be significantly suppressed by lowering the off gate voltage. Specifically, to lower the off gate voltage, the standard low voltage source, i.e., GND, in the memory cells can be replaced with a slightly negative voltage VSSL.

Figure 3:
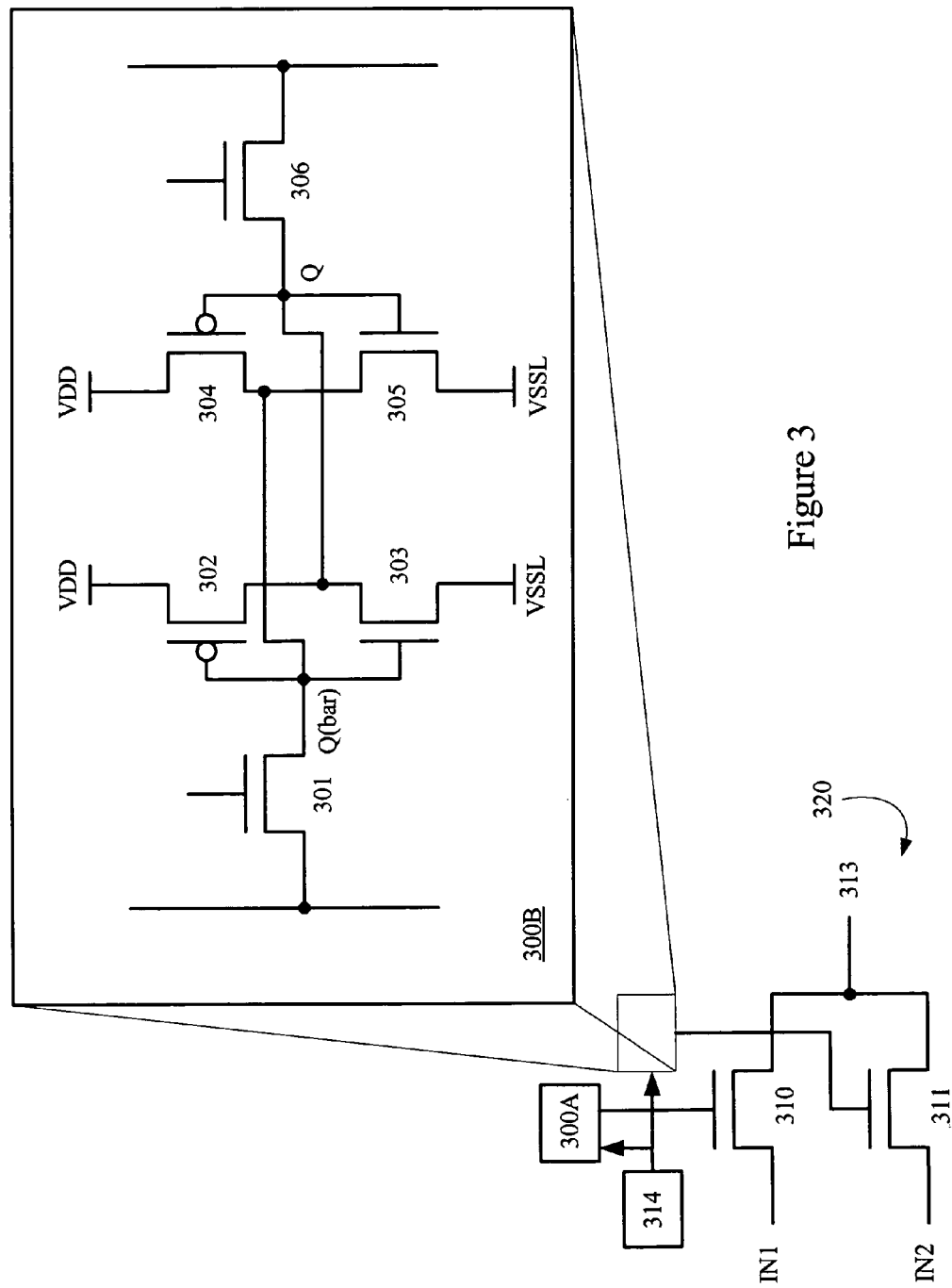
FIG. 3 illustrates an exemplary multiplexer that uses a negative voltage VSSL in the memory cells to suppress the sub-threshold leakage in the pass transistors.

FIG. 3 illustrates an exemplary multiplexer 320 that uses a negative voltage VSSL in memory cells 300A and 300B to suppress the sub-threshold leakage in pass transistors 310 and 311, which are coupled to output line 313. Note that transistors 301–306 perform substantially the same functions as transistors 201–206, and therefore are not explained in detail. However, of importance, transistors 303 and 305, when conducting, transfer negative voltage VSSL. Thus, memory cells 300A and 300B when programmed to output a logic zero provide this negative voltage VSSL. Negative voltage VSSL can be provided by any device for generating a predetermined voltage, e.g., a charge pump 314.

Note that a voltage $V_{GS}$ that is too negative can cause GIDL (gate-induced drain leakage)(which could actually result in an increase in current $I_{DS}$) or high gate stress (which could lower transistor reliability or even result in gate breakdown). Therefore, in one embodiment, negative voltage VSSL could be in the range of −0.05 V to −0.2 V. In one preferred embodiment, negative voltage VSSL can be −0.1 V.

Using negative voltage VSSL can dramatically reduce sub-threshold leakage. For example, assuming that the sub-threshold swing is 100 mV, if memory cell 300A/300B outputs −100 mV instead of 0 V, then the sub-threshold leakage of the controlled pass transistor (i.e., pass transistor 310/311) will decrease by 10×. Advantageously, this leakage reduction only affects off (i.e., inactive) devices, thereby resulting in no speed penalty for on (i.e., active) devices.

To apply this technique to a PMOS control device (which turns off when receiving a high voltage on its gate), the memory cell needs to supply a voltage higher than a standard high voltage (e.g., VDD). For example, for a 10× sub-threshold leakage reduction, voltage VDD could be replaced by a positive voltage VDDH, which can be equal to VDD+ n∘v$_t$.

FIG. 4A illustrates an exemplary 2-input NOR gate 400 that can receive negative voltage VSSL and positive voltage VDDH from a charge pump 410. NOR gate 400 can be reconfigured to either output 0 or invert its input signal IN. To output 0, a memory cell 411 can be programmed to output a logic 1, thereby turning off PMOS transistor 401 and turning on NMOS transistor 404. In this configuration, the output signal OUT of NOR gate 400 is 0 irrespective of the input signal IN. In this "inactive" state, because PMOS transistor 401 cuts off PMOS transistor 402 from its power source, positive voltage VDDH can effectively suppress the sub-threshold leakage of NOR gate 400.

To invert the input signal IN, memory cell 411 can be programmed to output a logic 0, thereby turning on PMOS transistor 401 and turning off NMOS transistor 404. In this configuration, PMOS transistor 401 provides a voltage source for PMOS transistor 402, wherein PMOS transistor 402 and NMOS transistor 403 in combination function as an inverter. In this "active" state, because NMOS transistors 403 and 404 are in parallel, negative voltage VSSL can suppress half the sub-threshold leakage in NOR gate 400. That is, power is saved only when input signal IN is logic 0. When input signal IN is logic 1, there is no leakage through NMOS transistor 404 because there is no voltage across it.

Suppressing sub-threshold leakage by providing an appropriate $V_{GS}$ to a transistor can also be applied to transmission gates. FIG. 4B illustrates an exemplary transmission gate 420 controlled by a memory cell 421. Memory cell 421 can receive negative voltage VSSL and positive voltage VDDH to suppress sub-threshold leakage in transmission gate 420. If transmission gate 420 is active, then memory cell 421 is programmed to provide negative voltage VSSL to the gate of PMOS transistor 423 and positive voltage VDDH to the gate of NMOS transistor 422. In this configuration, both NMOS transistor 422 and PMOS transistor 423 are on. Therefore, no sub-threshold leakage occurs. On the other hand, if transmission gate 420 is inactive, then memory cell 421 is programmed to provide negative voltage VSSL to the gate of NMOS transistor 422 and positive voltage VDDH to the gate of PMOS transistor 423. In this configuration, both NMOS transistor 422 and PMOS transistor 423 are off and voltages VSSL and VDDH can advantageously suppress sub-threshold leakage in transmission gate 420.

Advantageously, with lower leakage power, it is possible to make an active circuit faster. That is, leakage power can be traded for speed, and vice versa. For example, low-$V_{TH}$ transistors, which typically exhibit higher speed and higher leakage, could be used. If the decrease of $V_{TH}$ is less than the decrease of $V_{GS}$, then a combination of both leakage reduction and speed improvement can be achieved. If the decrease in $V_{TH}$ equals the decrease in $V_{GS}$, then the leakage reduction from reverse $V_{GS}$ is offset by the increased leakage from lower $V_{TH}$; however, the overall circuit will still be faster. Note that a higher supply voltage VDD can also make an active circuit faster. Specifically, speed has roughly a linear dependency on VDD, whereas sub-threshold leakage has an exponential dependency on VDD (due to Drain Induced Barrier Lowering (DIBL) effect).

Figure 5:
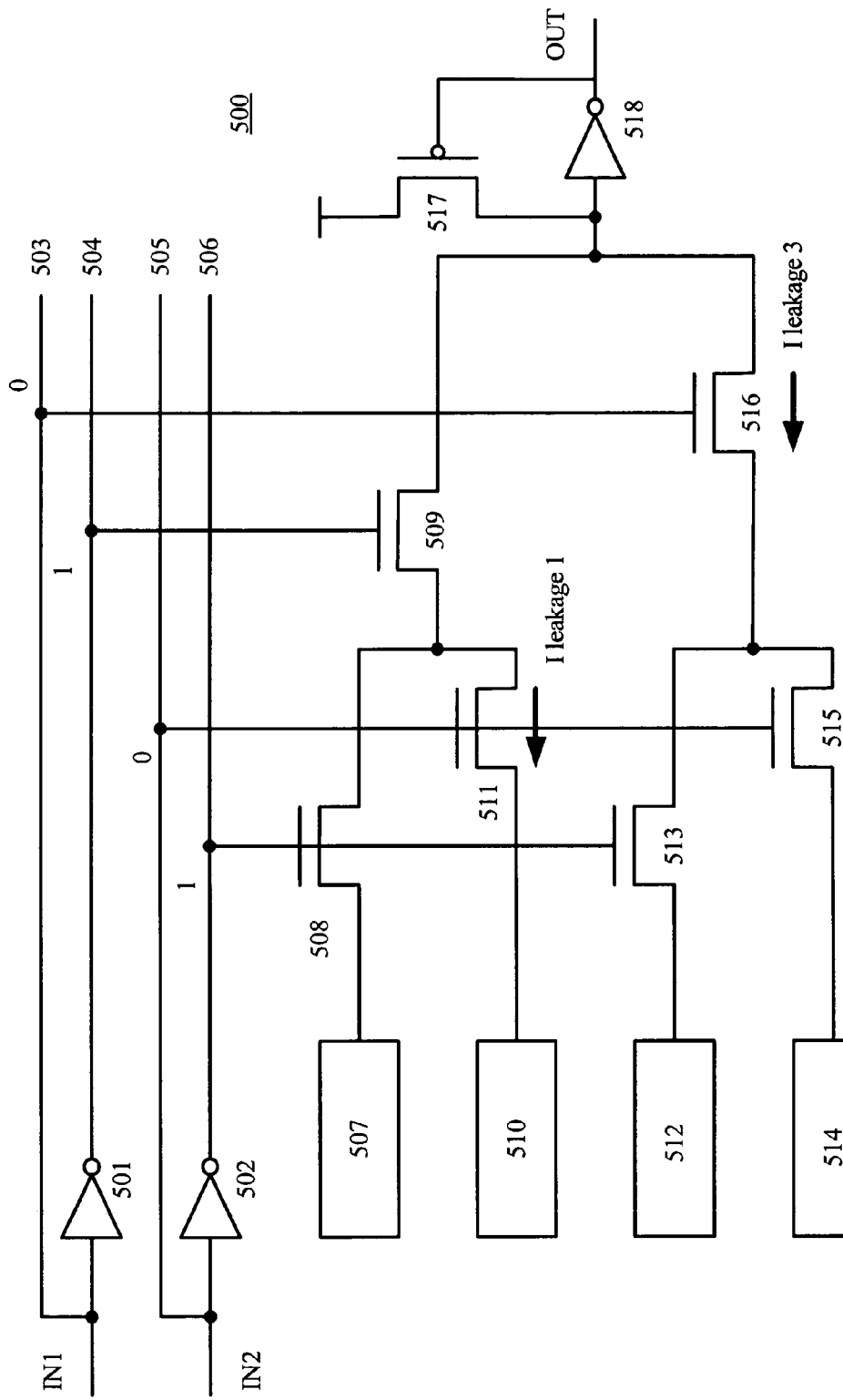
FIG. 5 shows a simplified standard lookup table (LUT).

In accordance with one feature of the invention, suppressing sub-threshold leakage voltage can also be achieved where the control device receives a signal from logic (not memory) in the circuit. For example, some PLDS, e.g., FPGAs, make extensive use of a lookup table (LUT) to implement desired logic functions. FIG. 5 shows a simplified standard LUT 500, which is mainly comprised of memory cells 507, 510, 512, and 514 and pass-transistors 508, 509, 511, 513, 515, and 516. Selection circuitry for LUT 500 includes a line 503 that provides an input signal IN1 to the gate of pass transistor 516, an inverter 501 that provides the inverted input signal IN1(bar) via a line 504 to the gate of pass transistor 509, a line 505 that provides an input signal IN2 to the gates of pass transistors 511 and 515, and an inverter 502 that provides the inverted input signal IN2(bar) via a line 506 to the gates of pass transistors 508 and 513.

Input signals IN1 and IN2 can select the appropriate LUT value (stored in one of memory cells 507, 510, 512, and 514) by controlling the gates of pass transistors 508, 509, 511, 513, 515, and 516. For example, in the illustrated input condition where IN1=0 and IN2=0, pass transistors 511, 515, and 516 are turned off and pass transistors 508, 509, and 513 are turned on. In this configuration, the LUT value stored in memory cell 507 can be provided to an output circuit including an inverter 518 and a transistor 517. Inverter 518 buffers the LUT value and generates an output signal OUT. If the LUT value is logic 0, then inverter 518 generates a logic 1 signal OUT, which turns off transistor 517. On the other hand, if the LUT value is logic 1, then inverter 518 generates a logic 0 signal OUT, which turns on transistor 517 and ensures a strong logic 1 signal is provided to the input of inverter 518.

However, of importance, input signals IN1 and IN2 are generated by user logic, not memory cells. In the illustrated input condition, pass transistors 511, 515, and 516 are turned off but may be leaking sub-threshold leakage power Ileakage1, Ileakage2, and Ileakage3, respectively (if, because of the contents of its associated memory cell, any pass transistor has a positive voltage across its source and drain). Unfortunately, these sub-threshold leakage components can be significant. Moreover, these sub-threshold leakage components are difficult to optimize because doing so could compromise the fast timing behavior of the LUT pass-transistors.

Figure 6:
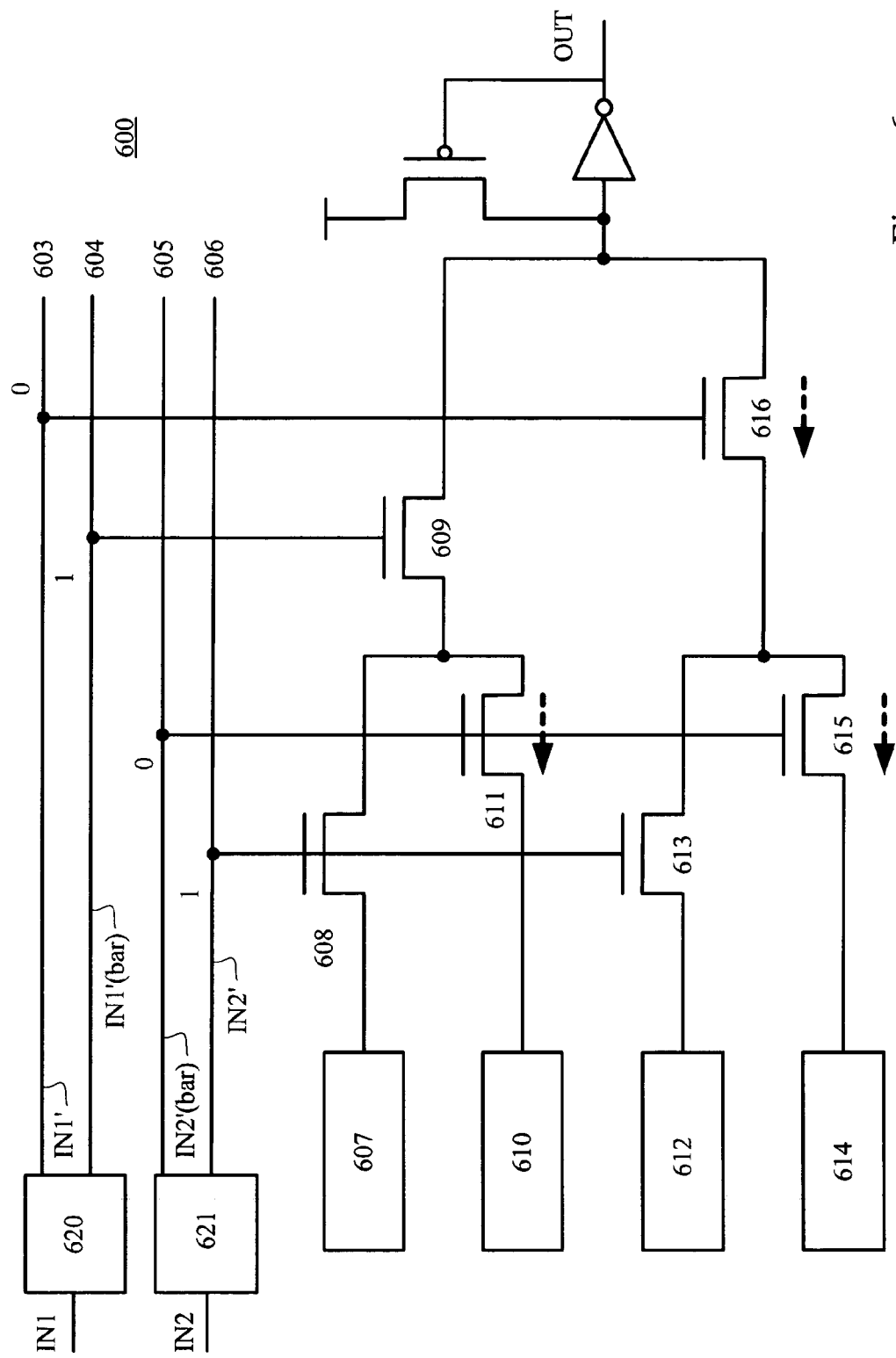
FIG. 6 illustrates one embodiment of a LUT in which level shifters can assist in suppressing the sub-threshold leakage in the pass transistors.

FIG. 6 illustrates one embodiment of a LUT 600 in which level shifters 620 and 621 can assist in suppressing the sub-threshold leakage in off pass transistors. LUT 600 includes memory cells 607, 610, 612, and 614 and pass-transistors 608, 609, 611, 613, 615, and 616. Selection circuitry for LUT 600 includes a line 603 that provides a level-shifted input signal IN1' to the gate of pass transistor 616, a line 604 that provides the inverted level-shifted input signal IN1'(bar) to the gate of pass transistor 609, a line 605 that provides a level-shifted input signal IN2' to the gates of pass transistors 611 and 615, and a line 606 that provides the inverted level-shifted input signal IN2'(bar) to the gates of pass transistors 608 and 613. Note that the memory cells, pass transistors, and output circuit of LUT 600 perform functions similar to those described in LUT 500.

Figure 7:
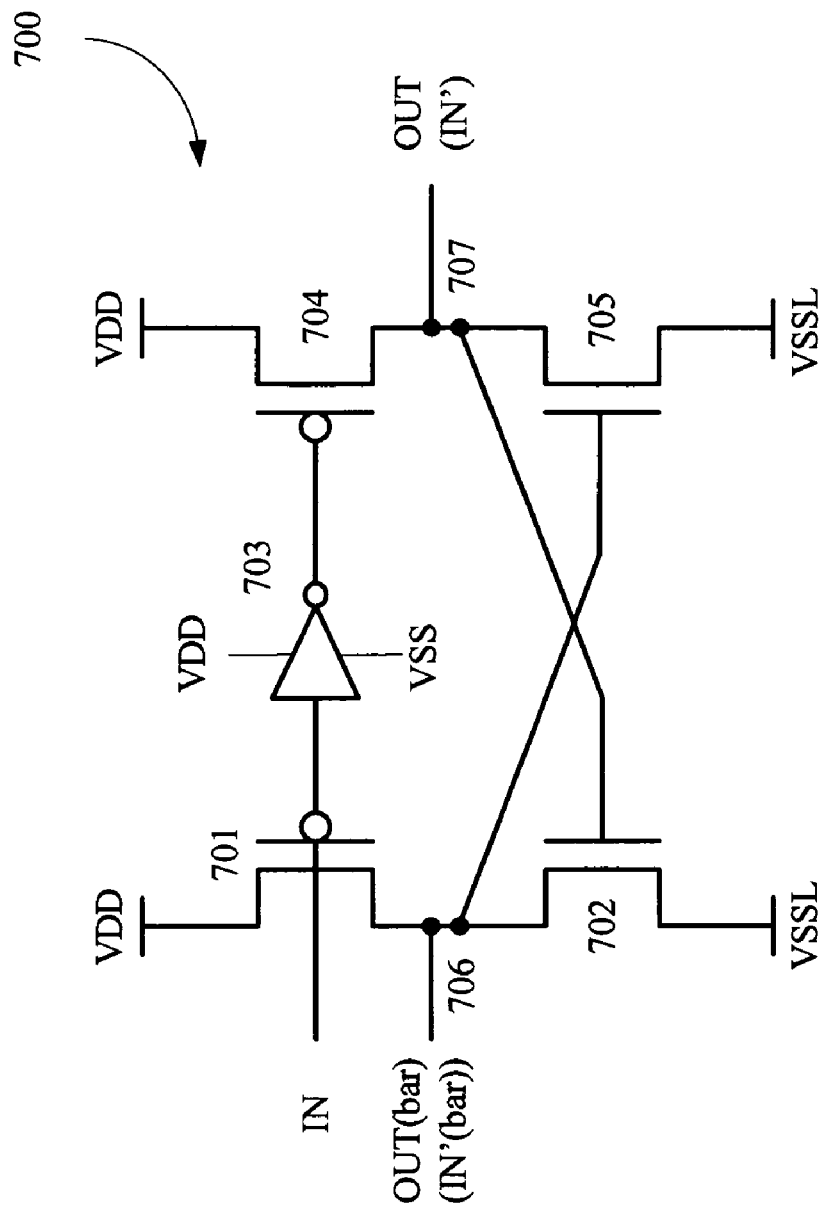
FIG. 7 illustrates an exemplary level shifter for generating a negative voltage as a logic zero signal.

Of importance, level-shifters 620 and 621 can generate logic 0 signals less than 0 V, e.g., −100 mV. FIG. 7 illustrates an exemplary level shifter 700 for generating such a negative voltage. In this embodiment, level shifter 700 includes a PMOS transistor 701 connected in series with an NMOS transistor 702, wherein the source of PMOS transistor 701 is connected to a standard voltage supply VDD and the source of NMOS transistor 702 is connected to a negative voltage supply VSSL. Level shifter 700 further includes a PMOS transistor 704 connected in series with an NMOS transistor 704, wherein the source of PMOS transistor 704 is connected to the standard voltage supply VDD and the source of NMOS transistor 705 is connected to the negative voltage supply VSSL. In one embodiment, negative supply voltage VSSL can be approximately −100 mV.

The gate of PMOS transistor 701 receives an input signal IN for level shifter 700. In contrast, the gate of PMOS transistor 704 receives the inverted input signal IN(bar) as generated by an inverter 703 (which receives standard supply voltages VDD and VSS (e.g., GND)). The gate of NMOS transistor 705 is connected to node 706, which is located at the drains of transistors 701 and 702. Note that node 706 provides the inverted output signal OUT(bar) of level shifter 700. This output signal OUT(bar) can be provided as the inverted level-shifted input signal IN'(bar) (e.g., IN1'(bar) or IN2'(bar)) in FIG. 6. The gate of NMOS transistor 702 is connected to node 707, which is located at the drains of transistors 704 and 705. Node 707 provides an output signal OUT of level shifter 700. This output signal OUT can be provided as the level-shifted input signal IN' (e.g., IN1' or IN2') in FIG. 6.

If level shifter 700 receives a logic 0 input signal IN, then transistor 701 is turned on and inverter 703 provides a logic 1 signal to the gate of transistor 704, thereby turning off transistor 704. In this configuration, transistor 701 transfers the supply voltage VDD to node 706, thereby turning on transistor 705 and providing the negative voltage supply VSSL to node 707. The negative voltage on node 707 turns off transistor 702. Thus, by using level shifter 700, a logic 0 input signal IN can be advantageously level shifted to the negative voltage VSSL.

In contrast, if level shifter 700 receives a logic 1 input signal IN, then transistor 701 is turned off and inverter 703 provides a logic 0 signal to the gate of transistor 704, thereby turning on transistor 704. In this configuration, transistor 704 transfers the supply voltage VDD to node 707, thereby turning on transistor 702 and providing the negative voltage supply VSSL to node 706. The negative voltage on node 706 turns off transistor 705. In this case, the logic 1 input signal IN is not level shifted, i.e., it should be substantially the same as supply voltage VDD. However, because NMOS pass transistors are used in LUT 600 (FIG. 6), level shifting is only desirable when any pass transistor should be turned off, i.e., when the input signal IN is a logic 0.

Thus, with level shifters 620 and 621 in LUT 600 and IN1=IN2=0, the off pass transistors in LUT 600 controlled by non-inverted input signals (e.g., in this configuration, transistors 611, 615, and 616) have their $V_{GS}$ equal to −100 mV. Referring also to FIG. 1, if the sub-threshold swing for the pass transistors in LUT 600 is 100 mV, then under-driving such pass transistors by 100 mV will reduce their sub-threshold leakage by 10×. As described above, any on pass transistors are not affected. Therefore, the speed performance of LUT 600 is unaffected.

Note that in this embodiment of LUT 600, input signals IN1 and IN2 can also be level-shifted to have a positive signal greater than VDD to over-drive LUT 600 and improve its speed performance.

Figure 8:
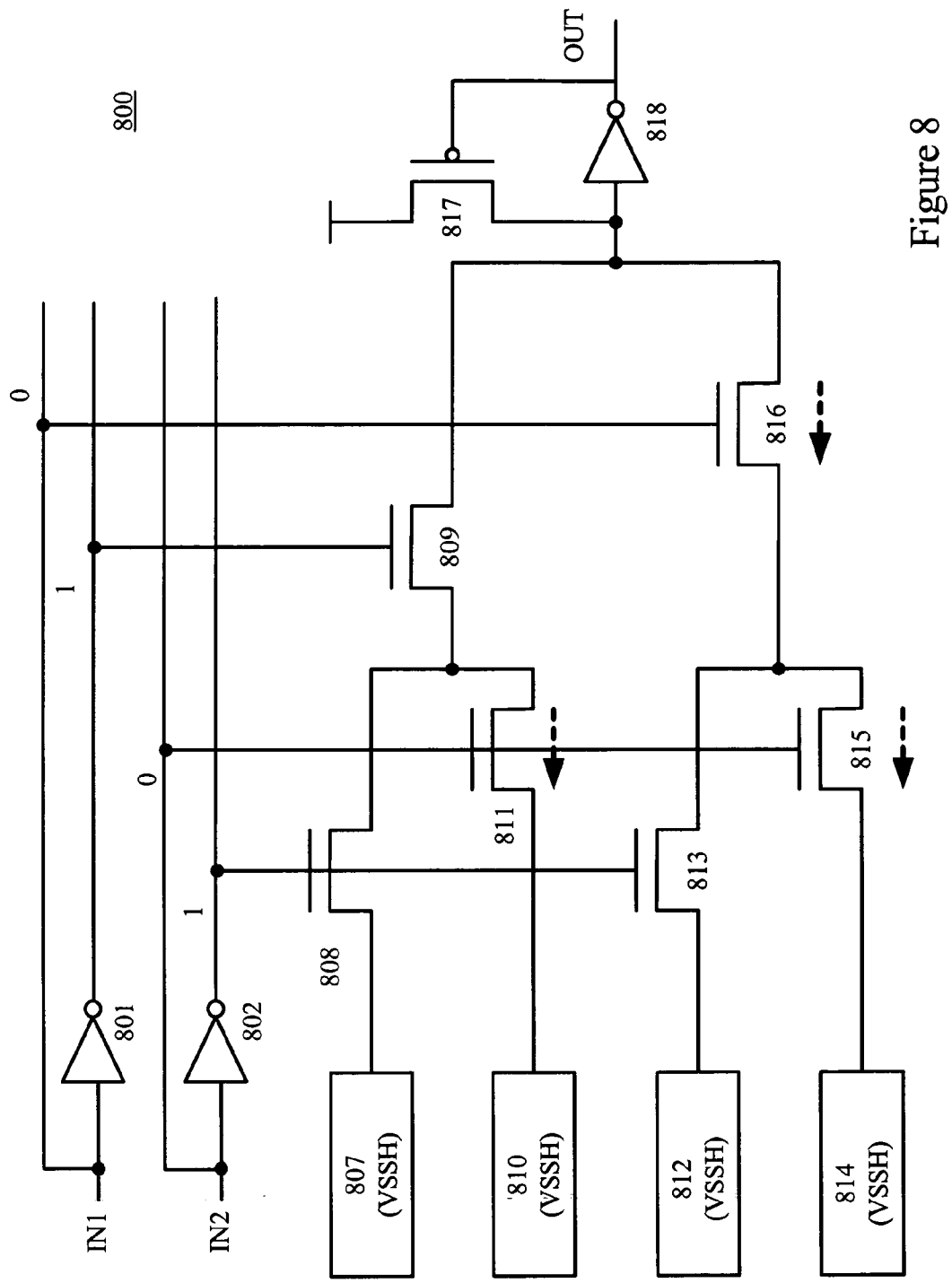
FIG. 8 illustrates an exemplary LUT that can under-drive its pass transistors. In this embodiment, the memory cells of the LUT receive a slightly higher voltage than ground, i.e., VSSH.
Figure 9A:
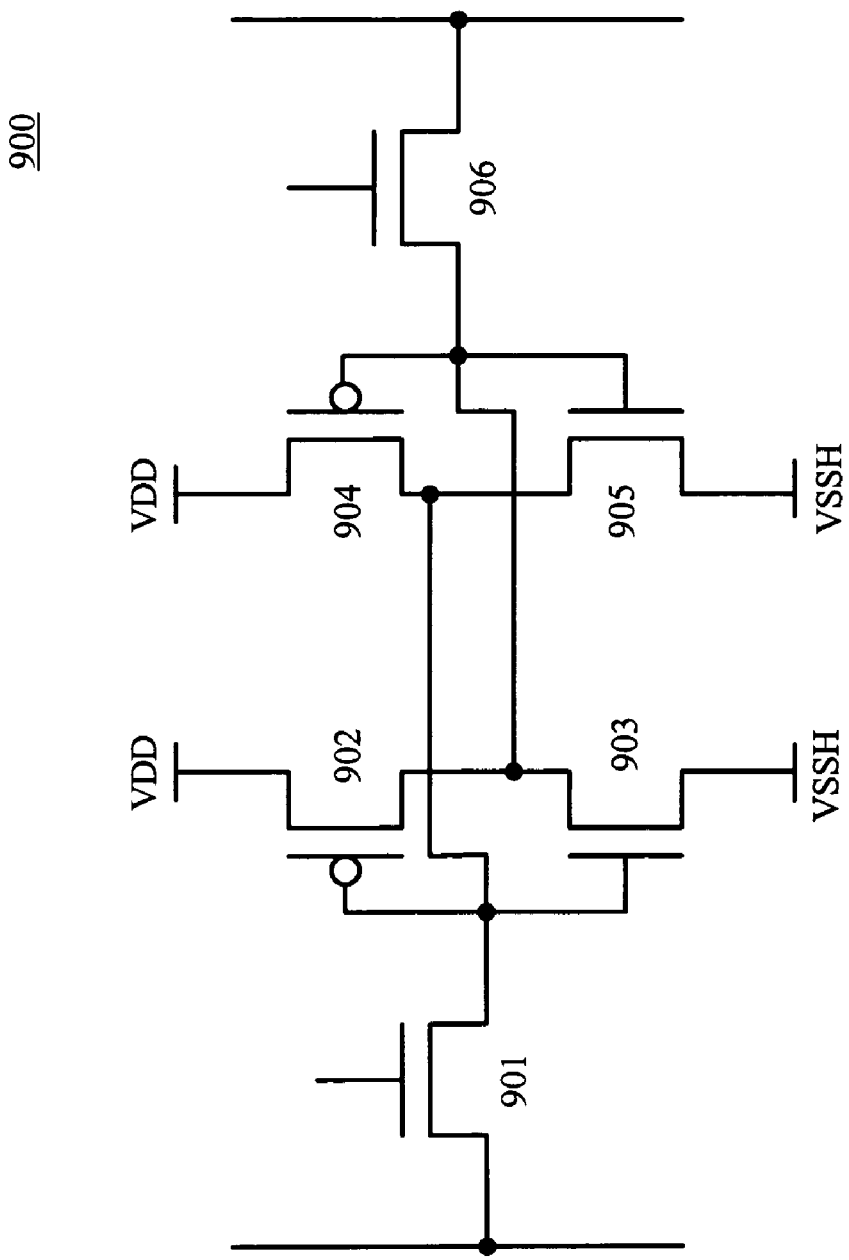
FIG. 9A illustrates an exemplary memory cell that can provide a slightly higher voltage than ground, i.e., VSSH, as a logic zero signal.

FIG. 8 illustrates another exemplary LUT 800 that can under-drive its pass transistors. Note that the inverters, pass transistors, and output circuit of LUT 800 perform functions similar to those described in LUT 500. Specifically, in this embodiment, the input signals IN1 and IN2 are not level-shifted, but memory cells 807, 810, 812, and 814 can be modified to output a slightly higher voltage than GND when a logic 0 value is stored. FIG. 9A illustrates an exemplary memory cell 900 that can provide this slightly higher voltage, i.e., VSSH. In one embodiment, VSSH can be between 0 and approximately 0.2 V. For example, VSSH could be approximately 100 mV. Note that transistors 901–906 perform functions similar to transistors 301–306, described in reference to FIG. 3. However, of importance, memory cell 900 can provide VSSH as a logic 0 signal. Thus, the net result of this configuration is the same as that described in reference to FIGS. 6 and 8, i.e., the off pass transistors have a slightly negative $V_{GS}$ (e.g., −100 mV), thereby significantly reducing their sub-threshold leakage.

Figure 9B:
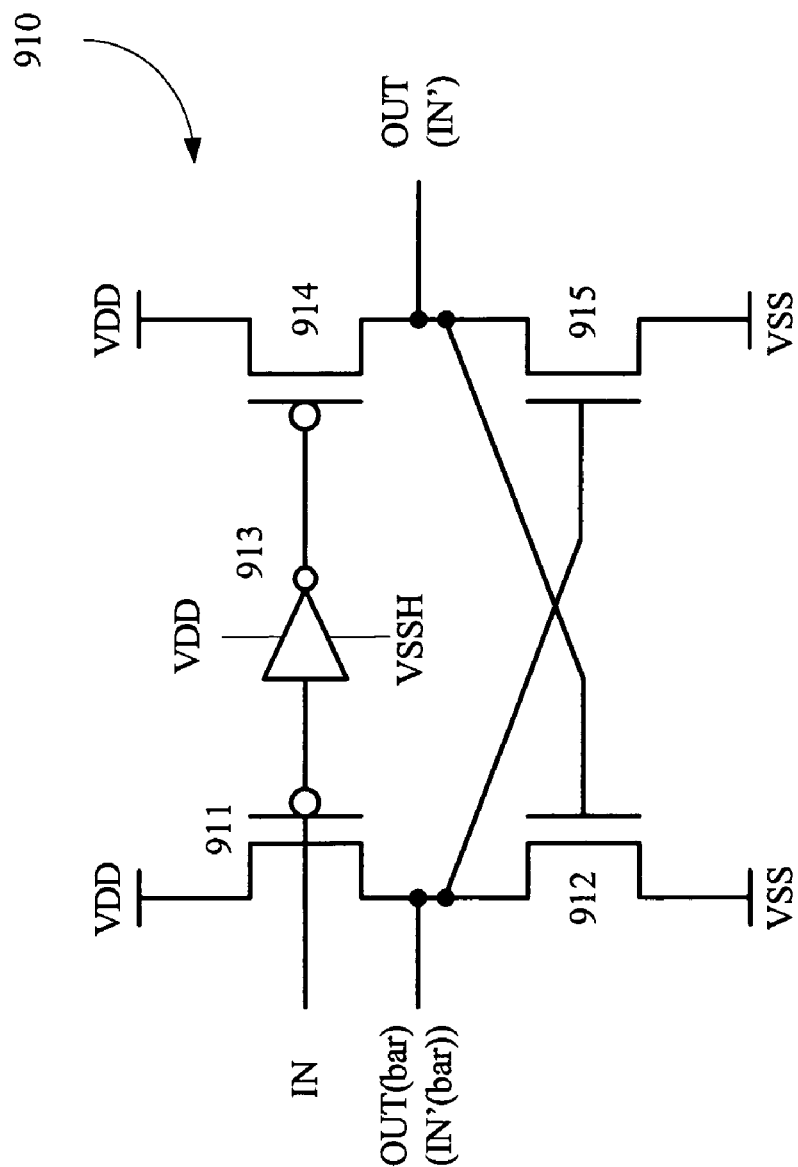
FIG. 9B illustrates one embodiment of a level shifter that provides a voltage shift from VSSH to VSS.

In one embodiment, because pass transistors 808, 809, 811, 813, 815, and 816 swing between VSSH and VDD, inverter 818 can be implemented with a level shifter that shifts VSSH/VDD to VSS/VDD. FIG. 9B illustrates one embodiment of a level shifter 910 that provides this shift. Note that transistors 911, 912, 914, and 915 and inverter 913 perform functions similar to transistors 701, 702, 704, and 705 and inverter 703, described in reference to FIG. 7. However, to provide the appropriate voltage shift, inverter 913 can be provided voltages VDD/VSSH and transistors 912 and 915 can receive voltage VSS as a source voltage.

Figure 10:
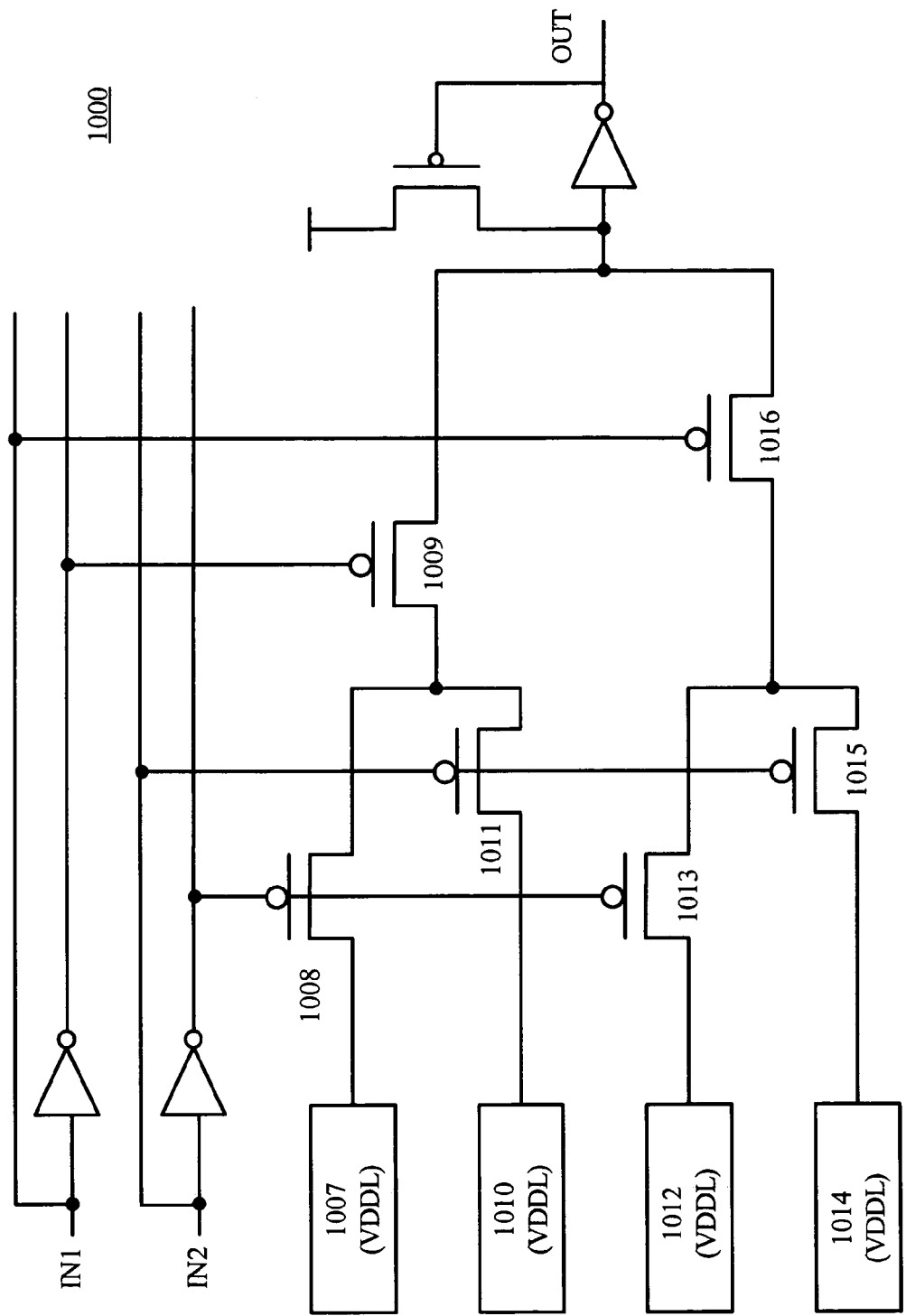
FIG. 10 illustrates an exemplary LUT that includes a plurality of pass transistors implemented with PMOS transistors. In this embodiment, the memory cells of the LUT receive a slightly lower voltage than a standard high voltage source, i.e., VDDL.
Figure 11:
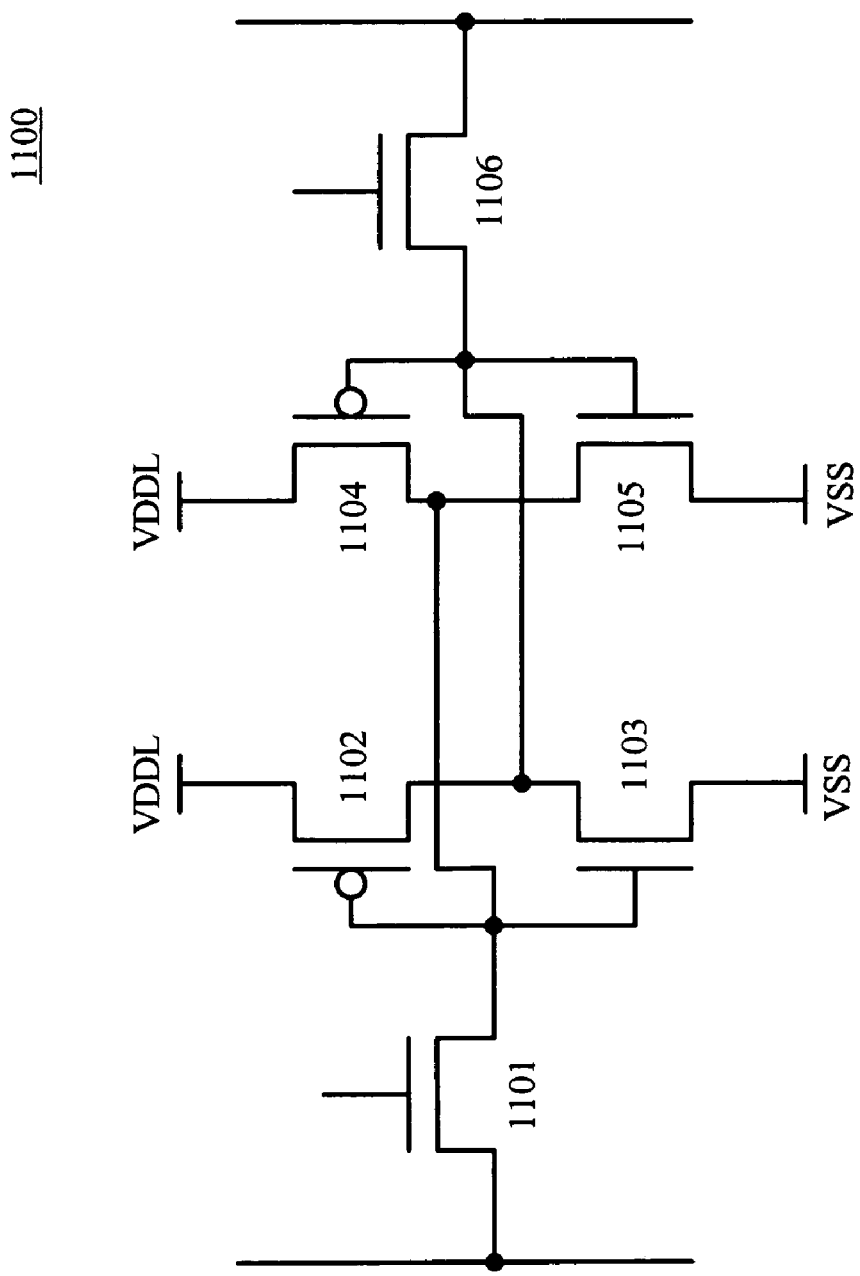
FIG. 11 illustrates an exemplary memory cell that can provide a slightly lower voltage than a standard high voltage supply, i.e., VDDL, as a logic 1 signal.

Note that this technique can also be applied to LUTs implemented with PMOS pass transistors. For example, FIG. 10 illustrates an exemplary LUT 1000 that includes a plurality of pass transistors 1008, 1009, 1011, 1013, 1015, and 1016 implemented with PMOS transistors. In this configuration, to provide a slightly negative $V_{GS}$, memory cells 1007, 1010, 1012, and 1014 can be modified to provide a slightly lower positive voltage than VDD when storing a logic one value. FIG. 11 illustrates an exemplary memory cell 1100 that can provide this slightly lower positive voltage, i.e., VDDL. In one embodiment, VDDL can be VDD−N, wherein 0<N∘0.2 V. For example, VDDL could be approximately VDD−0.1 V. Note that transistors 1101–1106 perform functions similar to transistors 301–306, described in reference to FIG. 3. However, of importance, memory cell 1100 can provide a logic 1 signal of VDDL, instead of VDD, thereby suppressing the sub-threshold leakage of the pass transistors in FIG. 10.

Figure 12:
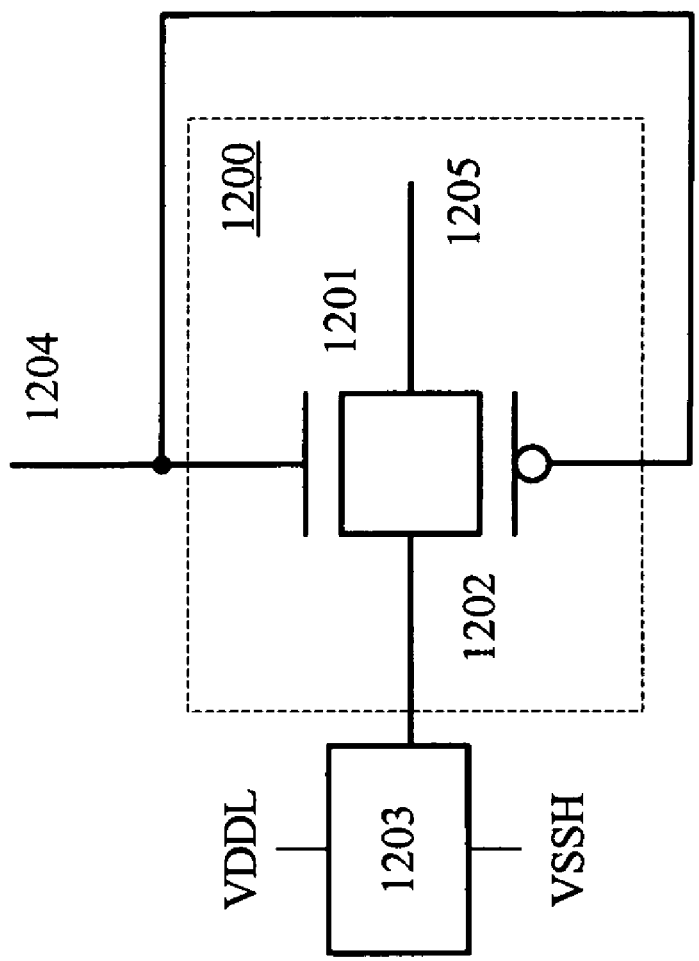
FIG. 12 illustrates a memory cell that can provide VSSH when storing a logic 0 value and VDDL when storing a logic 1 value. The stored value can be provided to a transmission gate, thereby suppressing sub-threshold leakage in the off transistor of the gate.

This technique can also be applied to LUTs implemented with full CMOS transmission gates. FIG. 12 illustrates an exemplary transmission gate 1200 (including an NMOS transistor 1201 and a PMOS transistor 1202) and a memory cell 1203 of such a LUT. Of importance, memory cell 1203 can provide VSSH when storing a logic 0 value and VDDL when storing a logic 1 value. Line 1204, which is connected to the gates of transistors 1201 and 1202, receives one of IN1, IN1(bar), IN2, and IN2(bar). Line 1205 is coupled to the output of the LUT.

Although illustrative embodiments of the invention have been described in detail herein with reference to the figures, it is to be understood that the invention is not limited to those precise embodiments. They are not intended to be exhaustive or to limit the invention to the precise forms disclosed. As such, many modifications and variations will be apparent. For example, although common PLD structures have been described herein, suppressing sub-threshold leakage techniques can be equally applied to application specific integrated circuits (ASICs), hybrid technology integrated circuits including both ASIC and PLD aspects, and system on a chip (SOC) devices. Additionally, the pass transistors in multiplexers (see, for example, FIG. 3) and LUTs (see, for example, FIG. 6) can be implemented using PMOS transistors or transmission gates instead of NMOS transistors. Accordingly, it is intended that the scope of the invention be defined by the following claims and their equivalents.

The invention claimed is:

1. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is an NMOS device, then applying includes:
   providing a slightly negative voltage from the memory cell to the gate of the transistor.

2. The method of claim 1, wherein the slightly negative voltage is between 0 and approximately −0.2 V.

3. The method of claim 1, wherein the slightly negative voltage is approximately −0.1 V.

4. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is an NMOS device, then applying includes:
   providing a first voltage from the memory cell to the gate of the transistor,
   wherein the first voltage is slightly less than a second voltage provided to a source of the transistor.

5. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is an NMOS device having a gate voltage of 0 V, then applying includes:
   providing a slightly positive voltage to a source of the transistor.

6. The method of claim 5, wherein the slightly positive voltage is between 0 and approximately 0.2 V.

7. The method of claim 5, wherein the slightly positive voltage is approximately 0.1 V.

8. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is an NMOS device, then applying includes:
   providing a first voltage to a source of the transistor,
   wherein the first voltage is slightly greater than a second voltage provided from the memory cell to the gate of the transistor.

9. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is a PMOS device having a source voltage of VDD, then applying includes:
   providing a slightly more positive voltage than VDD from the memory cell to the gate of the transistor.

10. The method of claim 9, wherein the slightly more positive voltage is VDD+N, wherein $0 < N \leq 0.2$ V.

11. The method of claim 9, wherein the slightly negative voltage is approximately VDD+0.1 V.

12. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is a PMOS device, then applying includes:
   providing a first voltage from the memory cell to the gate of the transistor,
   wherein the first voltage is slightly greater than a second voltage provided to a source of the transistor.

13. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed,
   wherein if the transistor is a PMOS device having a gate voltage of VDD, then applying includes:
   providing a slightly less positive voltage than VDD to a source of the transistor.

14. The method of claim 13, wherein the slightly less positive voltage is VDD−N, wherein $0 < N \leq 0.2$ V.

15. The method of claim 13, wherein the slightly positive voltage is approximately VDD−0.1 V.

16. A method of suppressing sub-threshold leakage in a transistor of an integrated circuit, the method comprising:
   storing a value in a memory cell coupled to a gate of the transistor; and
   applying a gate to source voltage to the transistor that under-drives the transistor, wherein the sub-threshold leakage in the transistor is suppressed, wherein if the transistor is a PMOS device, then applying includes:
providing a first voltage to a source of the transistor, wherein the first voltage is slightly less than a second voltage provided from the memory cell to the gate of the transistor.

17. A method of suppressing sub-threshold leakage in a transistor of an integrated circuit, the method comprising:
storing a value in a memory cell coupled to a gate of the transistor; and
applying a gate to source voltage to the transistor that under-drives the transistor, wherein the sub-threshold leakage in the transistor is suppressed,
wherein applying includes:
providing a level shifter that receives a logic signal from the integrated circuit and generates a modified gate voltage for the transistor,
wherein the modified gate voltage is one of:
slightly less than a source voltage of the transistor, if the transistor is an NMOS device, and
slightly greater than a source voltage of the transistor, if the transistor is a PMOS device.

18. A memory cell for suppressing sub-threshold leakage in a transistor, the memory cell comprising:
a plurality of transistors configurable to store a value,
wherein the value can under-drive the transistor in its off state,
wherein under-driving the transistor suppresses the sub-threshold leakage in the transistor,
wherein if the transistor is an NMOS device having a source voltage of VSS and the memory cell drives a gate of the transistor, then the value is slightly more negative than VSS;
wherein if the transistor is a PMOS device having a source voltage of VDD and the memory cell drives a gate of the transistor, then the value is slightly more positive than VDD;
wherein if the transistor is an NMOS device having a gate voltage of VSS and the memory cell drives a source of the transistor, then the value is slightly more positive than VSS; and
wherein if the transistor is a PMOS device having a gate voltage of VDD and the memory cell drives a source of the transistor, then the value is slightly less than VDD.

* * * * *